(12) United States Patent
Kitade

(10) Patent No.: US 6,327,208 B1
(45) Date of Patent: Dec. 4, 2001

(54) SEMICONDUCTOR MEMORY DEVICE HAVING SELF REFRESH MODE

(75) Inventor: Osamu Kitade, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/645,610

(22) Filed: Aug. 25, 2000

(30) Foreign Application Priority Data

Nov. 29, 1999 (JP) .................................................. 11-337670

(51) Int. Cl.[7] ....................................................... G11C 7/00
(52) U.S. Cl. ......................... 365/222; 365/225.7; 365/233
(58) Field of Search ................................ 365/222, 225.7, 365/189.01, 233

(56) References Cited

U.S. PATENT DOCUMENTS 5,812,475 * 9/1998 Lee et al. ............................... 365/222

FOREIGN PATENT DOCUMENTS 64-32489    2/1989  (JP) .

* cited by examiner

Primary Examiner—Hoai V. Ho
(74) Attorney, Agent, or Firm—McDermott, Will & Emery

(57) ABSTRACT

In an REFS generation circuit included in a self refresh circuit of a DRAM, first to fifth N channel MOS transistors are connected in parallel with first to fifth fuses, and first to fifth P channel MOS transistors are connected in series with the first to fifth fuses. If the first to third and fifth fuses are blown to select a fourth clock signal and then the refresh performance is lowered, a third clock signal, for example, having a frequency shorter than the fourth clock signal is selected by rendering conductive only the third N channel MOS transistor and the third P channel MOS transistor of first to fifth N channel MOS transistors and the first to fifth P channel MOS transistors. Therefore, the refresh cycle can be shortened and a DRAM with a refresh failure can be repaired.

4 Claims, 17 Drawing Sheets

FIG.4A  VCC 

FIG.4C  SF4 
FIG.4D  SF1,SF2, SF8,SF16 
FIG.4E  φT 
FIG.4F  φ4 
FIG.4G  φ1,φ2, φ8,φ16 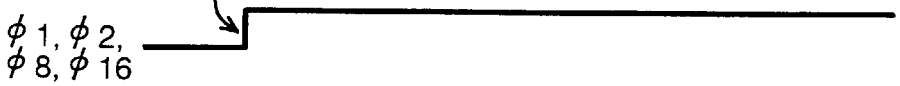
FIG.4H  /RAS 
FIG.4I  /CAS 
FIG.4J  PHYS 
FIG.4K  /PHYS 
FIG.4L  REFS 
TIME t →

SEMICONDUCTOR MEMORY DEVICE HAVING SELF REFRESH MODE

BACKGROUND OF THE INVENTION

1. Field of the Invention

The present invention relates to semiconductor memory devices and more particularly to a semiconductor memory device having a self refresh mode.

2. Description of the Background Art

FIG. 10 is a block diagram showing an overall configuration of a conventional dynamic random access memory (hereinafter, referred to as a DRAM). Referring to FIG. 10, the DRAM includes a POR (Power On Reset) circuit 31, a self refresh circuit 32, a clock generation circuit 33, a row/column address buffer 34, a row decoder 35, a column decoder 36, a memory mat 37, a data input buffer 40, and a data output buffer 41. Memory mat 37 has a memory array 38 and a sense amplifier+input/output control circuit 39.

In response to application of an external power supply potential VCC and an external ground potential VSS, POR circuit 31 outputs a signal /POR for resetting the DRAM. In response to external control signals /RAS, /CAS designating execution of refreshing, self refresh circuit 32 increments row address signals RA0 to RAm (m is an integer of at least 0) in a predetermined cycle. Clock generation circuit 33 selects a prescribed operation mode based on external control signals /RAS, /CAS, /WE and thus controls the entire DRAM.

Row/column address buffer 34 generates row address signals RA0 to RAm and column address signals CA0 to CAm according to external address signals A0 to Am, and applies signals RA0 to RAm and CA0 to CAm thus generated to row decoder 35 and column decoder 36, respectively.

Memory array 38 includes a plurality of memory cells each storing 1-bit data. Each memory cell is arranged at a prescribed address determined by row and column addresses.

Row decoder 35 designates row addresses of memory array 38 according to row address signals RA0 to RAm applied from row/column address buffer 34 or self refresh circuit 32. Column decoder 36 designates column addresses of memory array 38 according to column address signals CA0 to CAm applied from row/column address buffer 34.

Sense amplifier+input/output control circuit 39 reads out data of a memory cell at a row address designated by row decoder 35, and connects a memory cell at a column address designated by column decoder 36 to one end of a data input/output line pair IOP. The other end of data input/output line pair IOP is connected to data input buffer 40 and data output buffer 41. In a writing mode, data input buffer 40 applies externally input data D0 to Dn (n is an integer of at least 0) to selected memory cells through data input/output line pair IOP and rewrites data of the memory cells. In a reading mode, data output buffer 41 supplies read data Q0 to Qn as an output from selected memory cells in response to an external control signal /OE.

FIG. 11 is a circuit diagram showing a configuration of DRAM memory mat 37 shown in FIG. 10. Here, only a portion corresponding to 1/bit data DQ0 is shown.

In FIG. 11, memory array 38 includes a plurality of memory cells MCs arranged in rows and columns, a word line WL provided for each row, and a pair of bit lines BL, /BL provided for each column. Each memory cell MC includes an N channel MOS transistor for accessing and a capacitor for storing information as is well known. One end of word line WL is connected to row decoder 35.

Sense amplifier+input/output control circuit 39 includes a column selection line CLS, a column selection gate 42, a sense amplifier 43 and an equalizer 44 which are provided for each column. Column selection gate 42 includes two N channel MOS transistors connected between bit lines BL, /BL and data input/output lines IO, /IO, respectively. The two N channel MOS transistors have their gates connected to column decoder 36 through column selection line CSL. When column selection line CSL is raised to a logical high or H level selected state by column decoders 36, the two N channel MOS transistors are rendered conductive and thereby the pair of bit lines BL, /BL and the pair of data input/output lines IO, /IO are connected.

Sense amplifier 43 amplifies a small potential difference between the pair of bit lines BL, /BL to a power supply voltage VCC in response to sense amplifier activation signals SON, ZSOP attaining logical high and low or H and L levels, respectively. Equalizer 44 equalizes the potentials of bit lines BL, /BL to a bit line potential VBL in response to a bit line equalize signal BLEQ attaining an H level active state.

In the following, an operation of the DRAM shown in FIGS. 10 and 11 will be described. In the writing mode, column selection line CSL in a line corresponding to column address signal CA0 to CAm is raised to the H level selected state by column decoder 36, and column selection gate 42 in the column is rendered conductive.

In response to signal /WE, data input buffer 40 applies externally applied write data to a bit line pair BL, /BL in the selected column through data input/output line pair IO, /IO. The write data is applied as a potential difference between bit lines BL, /BL. Then, word line WL in a row corresponding to row address signal RA0 to RAm is raised to an H level selected state by row decoder 35, and N channel MOS transistors of memory cells MCs in that row are rendered conductive. Electric charges of such an amount that corresponds to the potential of bit line BL or /BL are stored in the capacitor of a selected memory cell MC.

In the reading mode, bit line equalize signal BLEQ is first lowered to an L level to stop equalization of bit lines BL, /BL, and word line WL in a row corresponding to row address signal RA0 to RAm is raised to an H level selected state by row decoder 35. The potentials of bit lines BL, /BL are slightly changed according to the amount of electric charges in the capacitor of activated memory cell MC.

Then, sense amplifier activation signals SON, ZSOP are driven to H and L levels, respectively, thus activating sense amplifier 43. When the potential of bit line BL is slightly higher than the potential of bit line /BL, the potential of bit line BL is raised to an H level and the potential of bit line /BL is lowered to an L level. Conversely, when the potential of bit line /BL is slightly higher than the potential of bit line BL, the potential of bit lines /BL is raised to an H level and the potential of bit line BL is lowered to an L level.

Then, column selection line CSL in a column corresponding to column address signal CA0 to CAm is raised to the H level selected state by column decoder 36 and thereby column selection gate 42 in the column is rendered conductive. Data of bit line pair BL, /BL in the selected column is applied to data output buffer 41 through column selection gate 42 and data input/output line pair IO, /IO. Data output buffer 41 supplies the read data as an output in response to signal /OE.

In a self refresh mode, row address signal RA0 to RAm generated by self refresh circuit 32 is applied to row decoder 35 instead of row address signal RA0 to RAm from row/ column address buffer 34. Row decoder 35 drives one word line WL of a plurality of word lines WL in memory array 38 to an H level selected state according to row address signal RA0 to RAm from self refresh circuit 32. Similarly to the reading mode, sense amplifier 43 and equalizer 44 are driven in synchronization with row decoder 35, and data once read out from each memory cell MC to bit line pair BL, /BL is written to memory cell MC again. Row address signal RA0 to RAm from self refresh circuit 32 is incremented in a prescribed cycle. Therefore, until a designation to stop self refreshing is issued, data in memory cells MCs in a plurality of rows included in memory array 38 is sequentially refreshed for each row.

FIG. 12 is a block diagram showing a configuration of self refresh circuit 32. In FIG. 12, self refresh circuit 32 includes a CBR determination circuit 51, a basic cycle generation circuit 52, an REFS generation circuit 53, an internal RAS generation circuit 54, and an internal address generation circuit 55. CBR determination circuit 51 raises an internal control signal CBR to an H level active state in response to reception of signals /CAS, /RAS at timing of CBR (/CAS before /RAS), that is, in response to signal /RAS falling to an L level active state after signal /CAS falls to an L level active state. Basic cycle generation circuit 52 is activated in response to the rise of signal CBR to the H level active state, and thereby outputs a clock signal PHYS and its complementary clock signal /PHYS having a constant cycle.

As shown in FIG. 13, REFS generation circuit 53 includes multiple stages (five stages in FIG. 13) of serially connected frequency dividers 61 to 65, five fuses 71 to 75 provided correspondingly to frequency dividers 61 to 65, and a pulse generator 76.

Frequency dividers 61 to 65 are reset by signals ST, RST, and they respectively output clock signals TN1, /TN1; . . . ; TN5, /TN5 each having a cycle twice as high as input clock signals PHYS, /PHYS; TN1, /TN1; . . . TN4, /TN4.

For example, frequency divider 65 at the last stage includes inverters 81, 82, N channel MOS transistors 83 to 92 and capacitance 93, 94 as shown in FIG. 14. Inverter 81 is connected between nodes N81 and N82, and inverter 82 is connected between nodes N82 and N81. Inverters 81 and 82 form a latch circuit. N channel MOS transistors 83, 84 are connected between a ground potential VSS line and nodes N81, N82, respectively, and have their gates receiving signals ST, RST, respectively. Signals appearing at nodes N81, N82 serve as output clock signals /TN5, TN5.

N channel MOS transistor 85 and capacitor 93 as well as N channel MOS transistor 86 and capacitor 94 are connected in series between nodes N81, N82 and the ground potential VSS line, respectively. The gates of N channel MOS transistors 85, 86 both receive output clock signals /TN4 of frequency divider 64 at the previous stage.

N channel MOS transistors 87, 89 as well as N channel MOS transistors 88, 90 are connected in series between nodes N81, N82 and the ground potential VSS line, respectively. The gates of N channel MOS transistors 87, 88 both receive clock signal TN4. The gates of N channel MOS transistors 89, 90 are connected to nodes N85, N86 between N channel MOS transistors 85, 86 and capacitors 93, 94. N channel MOS transistors 91, 92 are connected between nodes N85, N86 and the ground potential VSS line, respectively, and have their gates both connected to the ground potential VSS line. N channel MOS transistors 91, 92 are provided to release a surge current flowing in nodes N85, N86.

In the following, an operation of frequency divider 65 will be described. First, signals RST, ST are set to H and L levels, respectively, and signals TN4, TN5 are reset to an L level. Since signals /TN4 is at an H level at this time, N channel MOS transistors 85, 86 are rendered conductive and thereby nodes N85, N86 are driven to H and L levels, respectively. Furthermore, N channel MOS transistor 89 is rendered conductive, driving its drain (node N87) to an L level, and N channel MOS transistor 90 is rendered non-conductive, driving its drain (node N88) to a floating state.

When signal TN4 rises to the H level, N channel MOS transistors 87, 88 are rendered conductive and N channel MOS transistors 85, 86 are rendered non-conductive, and thus nodes N81, 82, that is, signals /TN5, TN5 are driven to L and H levels, respectively.

When signal TN4 falls to the L level thereafter, N channel MOS transistors 87, 88 are rendered non-conductive and N channel MOS transistors 85, 86 are rendered conductive, and thus nodes N85, N86 are driven to L and H levels, respectively. N channel MOS transistor 89 is rendered non-conductive, driving node N87 to a floating state while N channel MOS transistor 90 is rendered conductive, driving node N88 to an L level. At this time, the levels of signals TN5, /TN5 remain to be at the H and L levels, respectively.

When signal TN4 rises to the H level thereafter, N channel MOS transistors 87, 88 are rendered conductive and N channel MOS transistors 85, 86 are rendered non-conductive, and thus nodes N81, N82, that is, signals /TN5, TN5 are driven to H and L levels, respectively. Therefore, frequency divider 65 generates clock signals TN5, /TN5 each having its frequency twice as high as input clock signals TN4, /TN4. Other frequency dividers 61 to 64 have the same structure as frequency divider 65.

Referring back to FIG. 13, clock signals /TN1 to /TN5 generated by frequency dividers 61 to 65 are each applied to one electrode of a corresponding fuse 71 to 75. The other electrode of fuse 71 to 75 is connected to an input node 76a of pulse generator 76.

As shown in FIG. 15, pulse generator 76 includes a delay circuit 96 having odd-number stages (three stages in FIG. 15) of serially connected inverters 95, and an OR gate 97. Input node 76a is connected to one input node of OR gate 97 through delay circuit 96 and is also directly connected to the other input node of OR gate 97. An output signal from OR gate 97 serves as signal REFS.

When input node 76a is at an H level, the output signal of delay circuit 96 and signal REFS are at L and H levels, respectively. When input node 76a is driven to an L level, signal REFS falls to an L level. After a delay period of delay circuit 96, the output signal of delay circuit 96 attains an H level and signal REFS rises to the H level. Therefore, pulse generator 76 outputs a negative pulse of a prescribed pulse width in response to a fall of the input signal.

FIG. 16 is a timing chart showing an operation of REFS generation circuit 53 shown in FIGS. 13 to 15. Frequency dividers 61 to 65 output clock signals TN1, /TN1; . . . ; TN5, /TN5 each having its frequency twice as high as input clock signals PHYS, /PHYS; TN1, /TN1; . . . ; TN4, /TN4.

In a wafer state, a self refresh cycle is determined according to the performance of refreshing. Fuses (71 to 73, 75 in this case) other than the fuse (74, for example) to be refreshed are blown. Thus, only selected clock signal /TN4 of clock signals /TN1 to /TN5 is input to pulse generator 76 through fuse 74. Output signal REFS of pulse generator 76 assumes the L level for a prescribed pulse width in response to a falling edge of clock signal /TN4.

Referring back to FIG. 12, internal RAS generation circuit 54 generates signals /RASS, /RAS' in response to signal REFS. Signal /RASS assumes an L level for a prescribed pulse width in response to a rising edge of signal REFS as shown in FIG. 17. Signals /RAS' rises to an H level in response to a falling edge of signal REFS, and falls to an L level for a prescribed pulse width in response to a rising edge of signal REFS. It is noted that the pulse width of signal REFS is a cycle ½ times those of clock signals PHYS, /PHYS.

Referring back to FIG. 12, internal address generation circuit 55 is a (m+1)-bit counter, is activated in response to signal CBR attaining an H level active state, counts the pulse number of signal /RASS, and outputs row address signals RA0 to RAm. Therefore, row address signals RA0 to RAm are implemented each time signal /RASS falls to the L level. In the self refresh mode, instead of row address signals RA0 to RAm from row/column address buffer 34, row address signals RA0 to RAm generated by internal address generation circuit 55 are applied to row decoder 35.

Since conventional DRAMs are formed as described above, the self refresh cycle cannot be changed once it is set in a wafer state. Therefore, if the refresh performance is deteriorated by process variation after setting the self refresh cycle, the DRAM causes a refresh failure and becomes a defect.

SUMMARY OF THE INVENTION

Therefore, a main object of the present invention is to provide a semiconductor memory device capable of resetting a self refresh cycle.

A semiconductor memory device according to the present invention includes a first selection circuit including a plurality of first fuses for selecting one clock signal of a plurality of clock signals, a second selection circuit for selecting one clock signal of the plurality of clock signals according to an external signal, a gate circuit for receiving the plurality of clock signals, passing a clock signal when the clock signal is selected by the second selection circuit, and otherwise passing a clock signal selected by the first selection circuit, and a refresh execution circuit for refreshing memory cell data in synchronization with the clock signal which has passed through the gate circuit. Therefore, even if the first fuse of the first selection circuit is blown to set the self refresh cycle and the refresh performance is then lowered, application of an external signal to the second selection circuit can cause the self refresh cycle to be reset and repair the semiconductor memory device with a refresh failure.

Preferably, the second selection circuit includes a plurality of second fuses provided correspondingly to the plurality of clock signals, an external terminal provided correspondingly to each second fuse for applying a prescribed potential to blow a corresponding second fuse, and a logic circuit activated by a first external activation signal for selecting a clock signal corresponding to the blown second fuse. In this case, a desired clock signal can be selected by blowing a second fuse corresponding to the desired clock signal and applying the first external activation signal.

Preferably, the second selection circuit includes an address determination circuit activated in response to reception of a second external activation signal for selecting one clock signal of the plurality of clock signals according to a plurality of external address signals. In this case, a desired clock signal can be selected by applying the second external activation signal and the plurality of external address signals which are previously allocated to the desired clock signal.

Preferably, one electrode of each of the plurality of first fuses receives one of the plurality of clock signals, and the gate circuit includes a first transistor provided correspondingly to each first fuse, connected in parallel with a corresponding first fuse and rendered conductive in response to selection of a clock signal corresponding to the corresponding first fuse by the second selection circuit, and a second transistor provided correspondingly to each first fuse, connected in series with a corresponding first fuse and rendered non-conductive in response to selection of a clock signal other than the clock signal corresponding to the corresponding first fuse by the second selection circuit. In this case, the gate circuit can be formed easily.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A to 4L are timing charts illustrating a method of resetting a self refresh cycle of the DRAM shown in FIGS. 1 to 3.

DESCRIPTION OF THE PREFERRED EMBODIMENTS

First Embodiment

Figure 1:
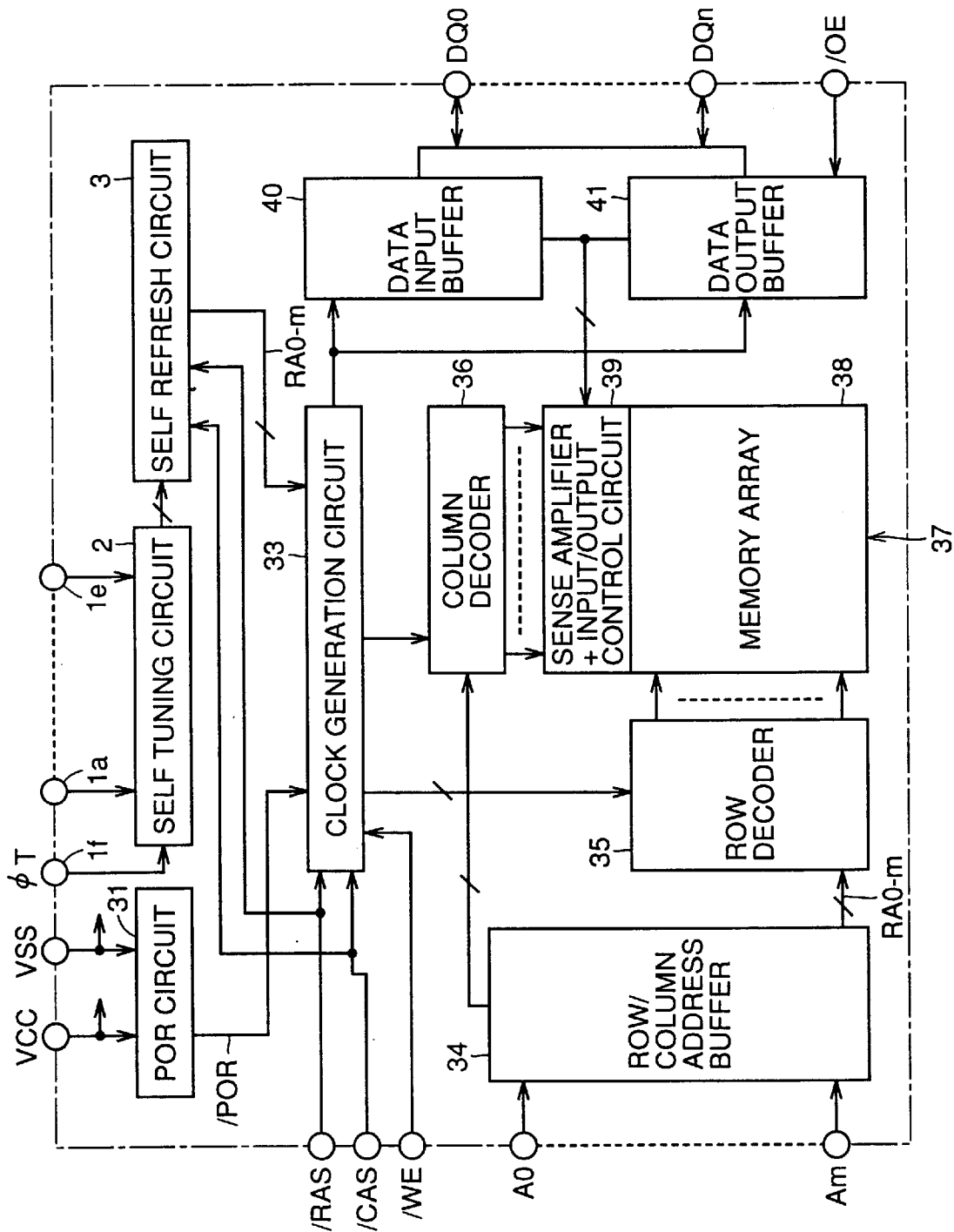
FIG. 1 is a block diagram showing an overall configuration of a DRAM according to a first embodiment of the present invention.
Figure 10:
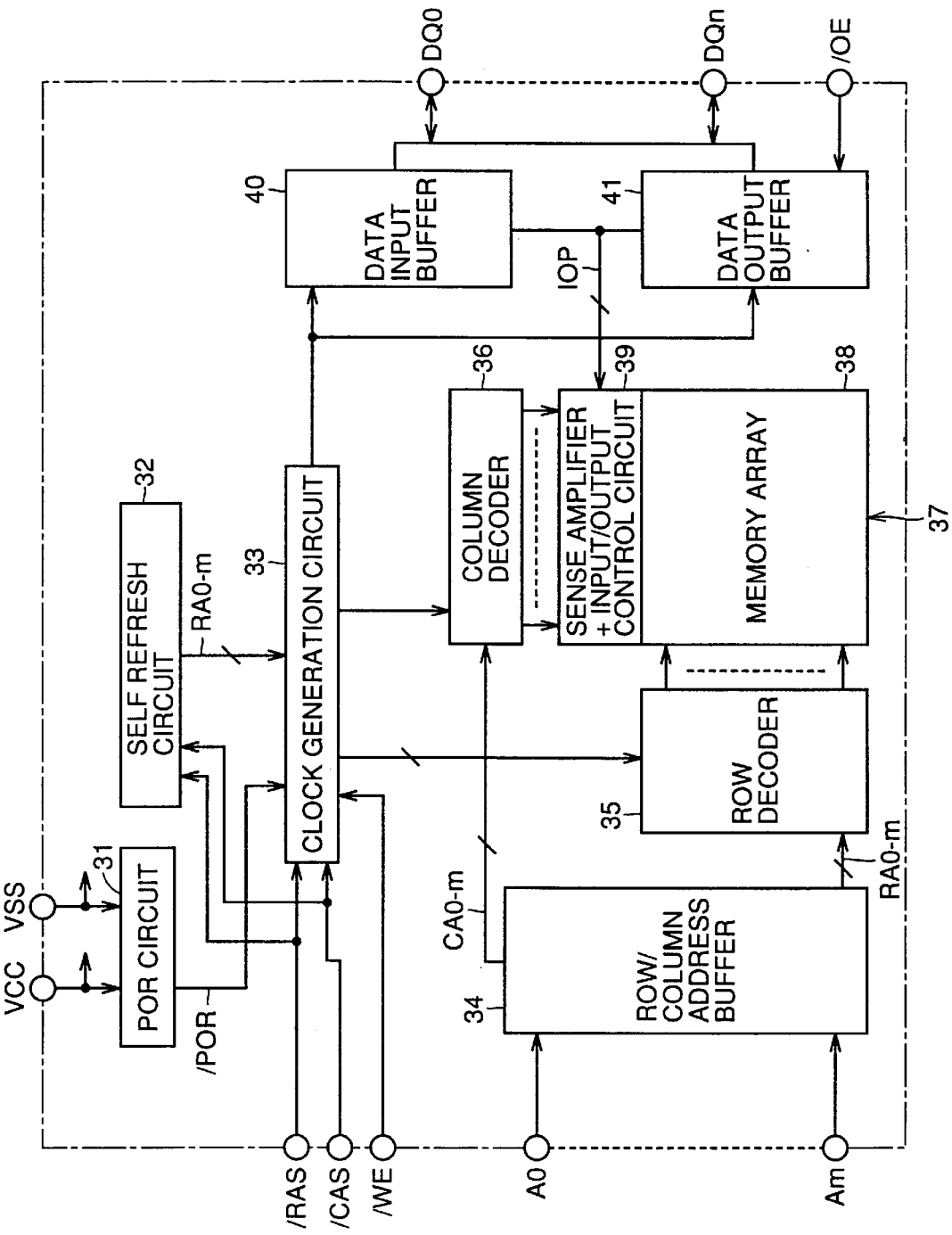
FIG. 10 is a block diagram showing an overall configuration of a conventional DRAM.
Figure 11:
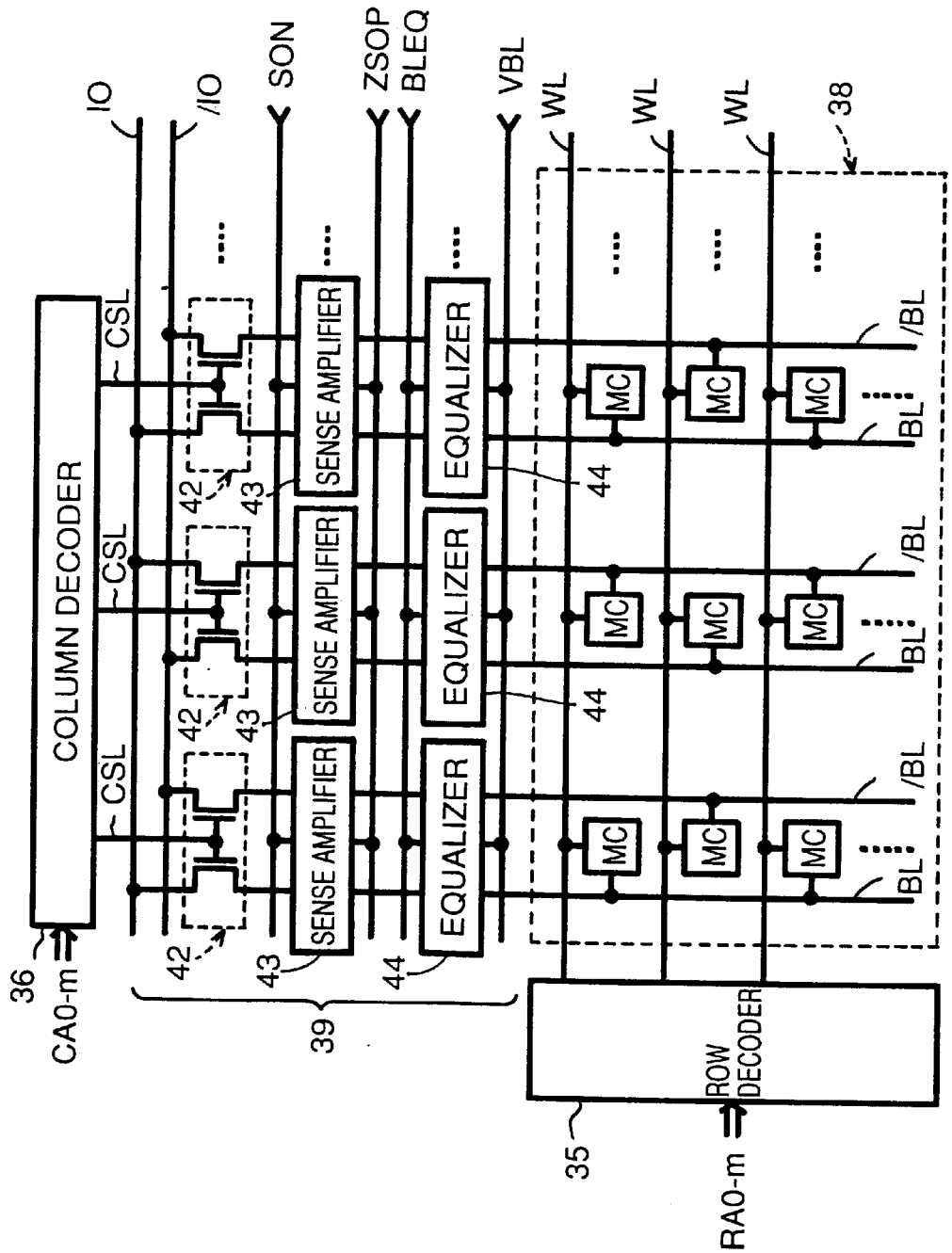
FIG. 11 is a circuit block diagram showing a configuration of the memory mat shown in FIG. 10.
Figure 12:
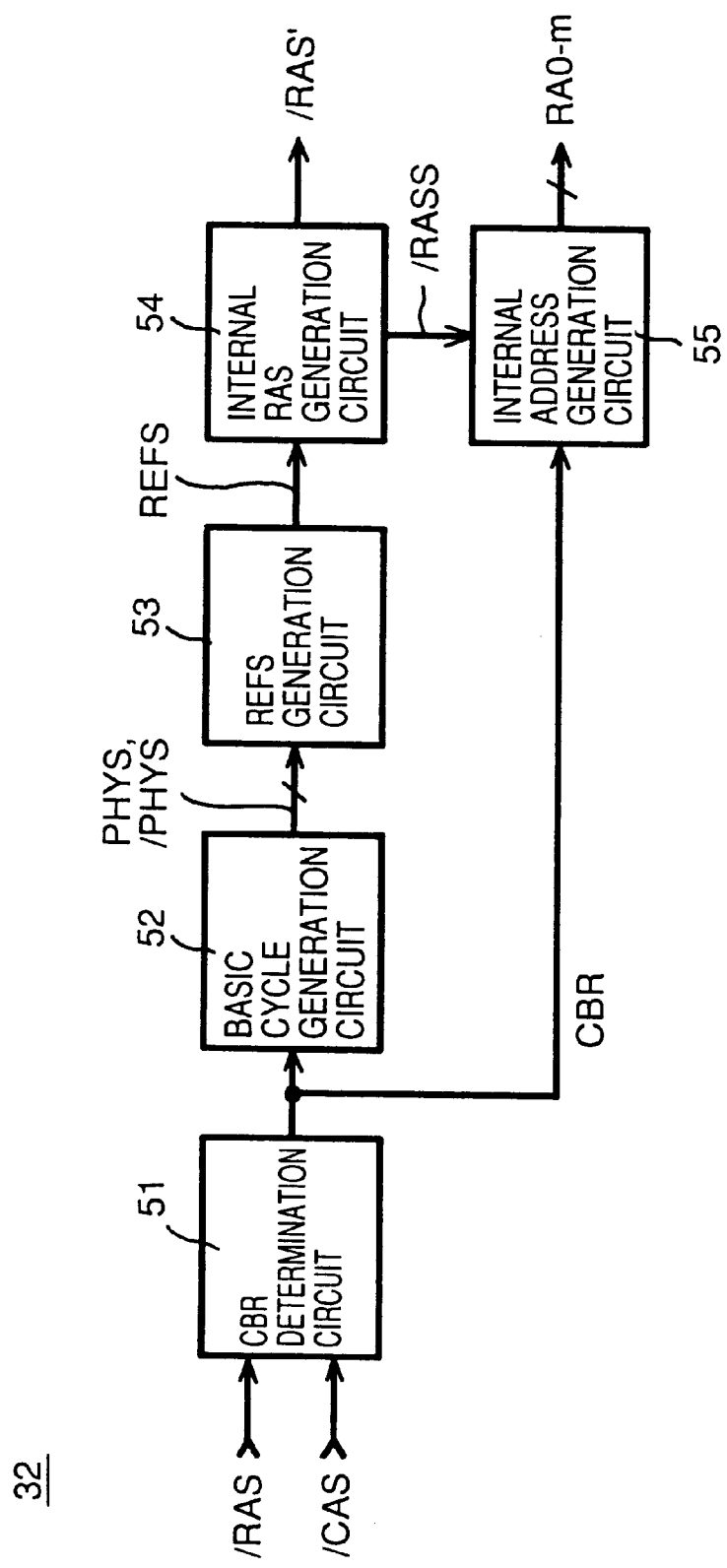
FIG. 12 is a block diagram showing a configuration of the self refresh circuit shown in FIG. 10.

FIG. 1 is a diagram comparable to FIG. 10, showing an overall configuration of a DRAM according to a first embodiment of the present invention. In FIG. 1, the DRAM is different from the DRAM in FIG. 10 in that terminals 1a to 1f for tuning (hereinafter, referred to as tuning terminals 1a to 1f) and a self tuning circuit 2 are added and self refresh circuit 3 replaces self refresh circuit 32.

Figure 2:
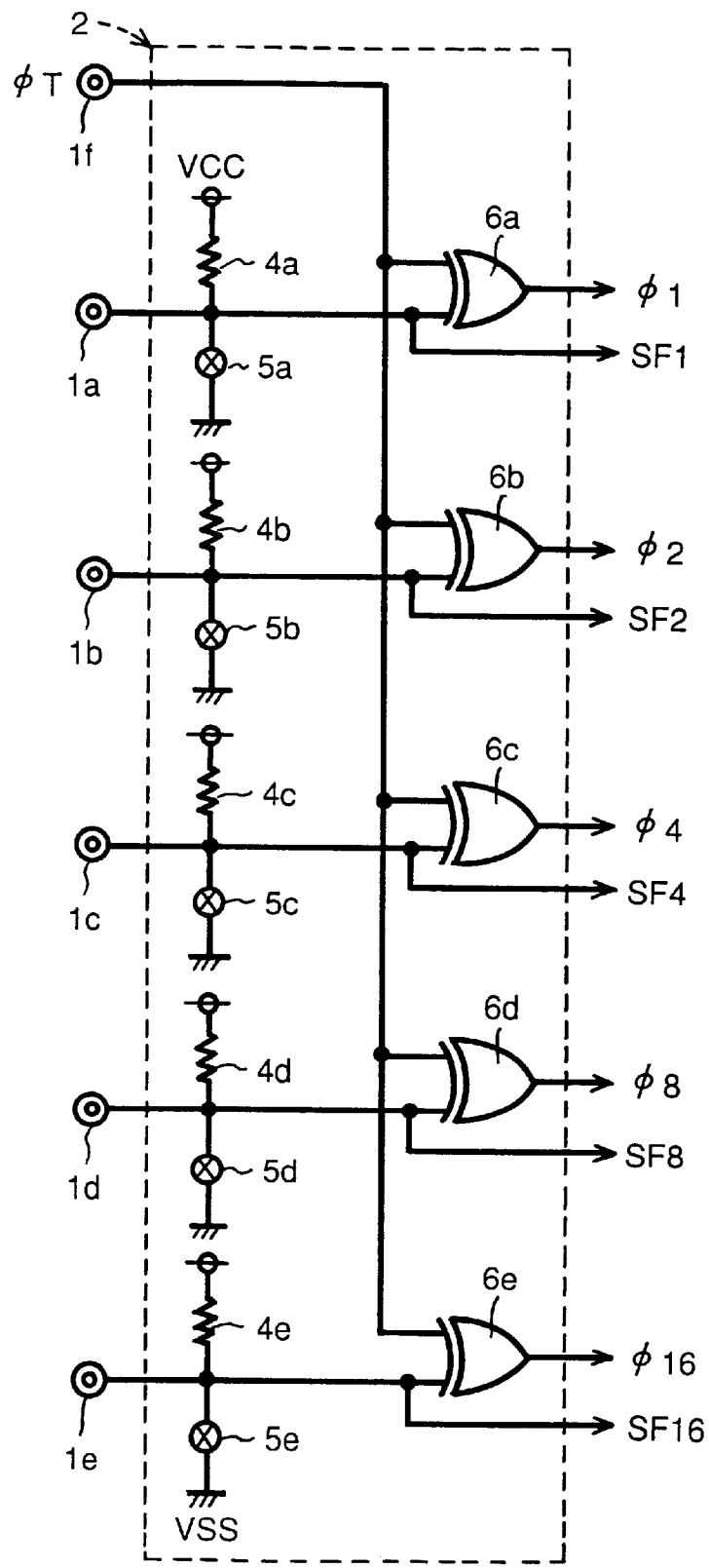
FIG. 2 is a circuit diagram showing a configuration of the self tuning circuit shown in FIG. 1.

As shown in FIG. 2, self tuning circuit 2 includes resistors 4a to 4e, fuses 5a to 5e, and EX-OR gates 6a to 6e. Resistors 4a to 4e are respectively connected between a power supply potential VCC line and terminals 1a to 1e. Fuses 5a to 5e are respectively connected between terminals 1a to 1e and a ground potential VSS line. Terminals 1a to 1e are each connected to one input node of each of EX-OR gates 6a to 6e. Terminal 1f is connected to the other input node of each of Ex-OR gates 6a to 6e. Signals appealing at tuning terminals 1a to 1e serve as signals SF1, SF2, SF4, SF8, SF16 and output signals from EX-OR gates 6a to 6e serve as signals φ1, φ2, φ4, φ8, φ16.

Figure 3:
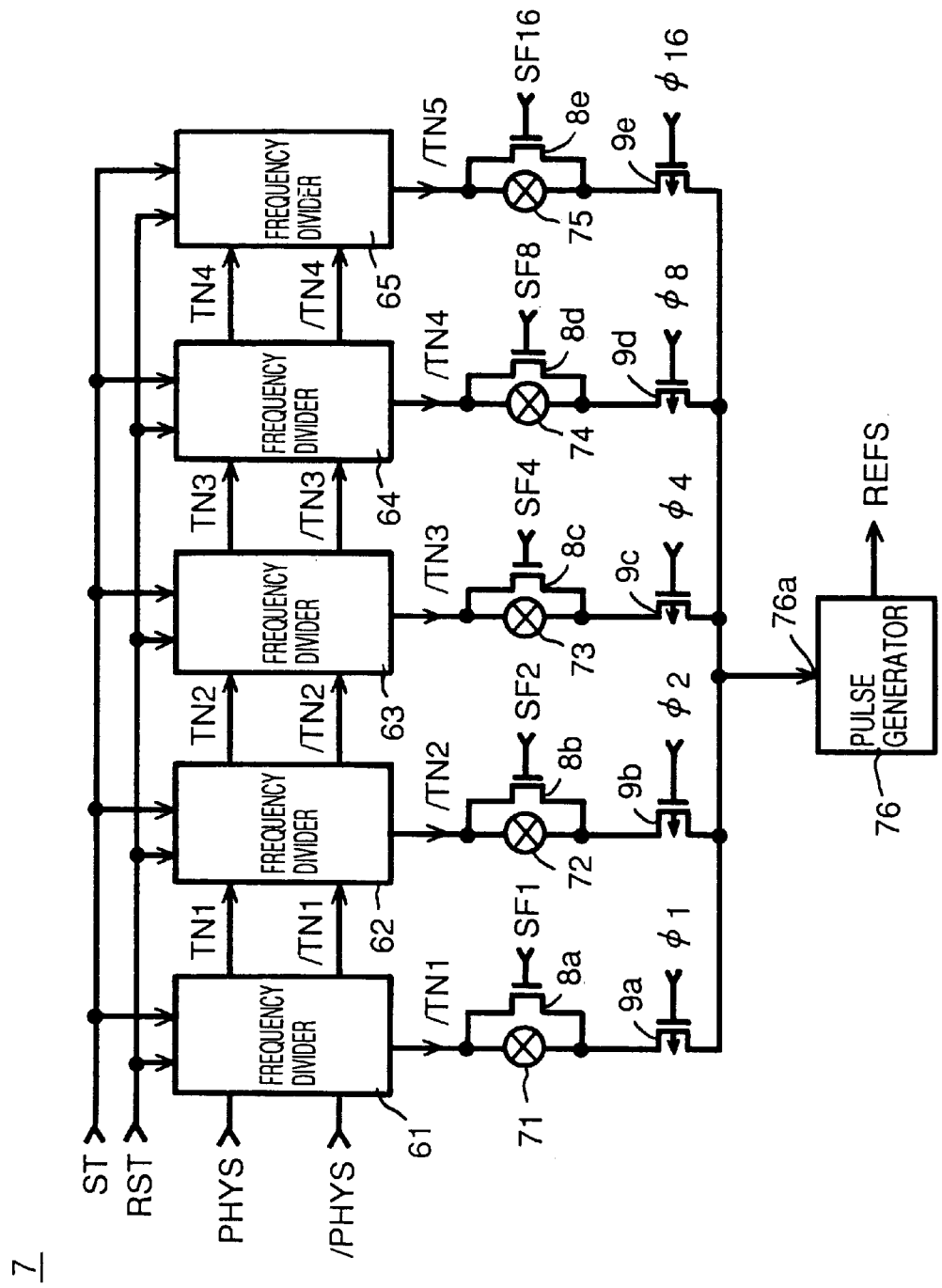
FIG. 3 is a circuit block diagram showing a configuration of an REFS generation circuit included in the self refresh circuit shown in FIG. 1.
Figure 4B:
Figure 13:
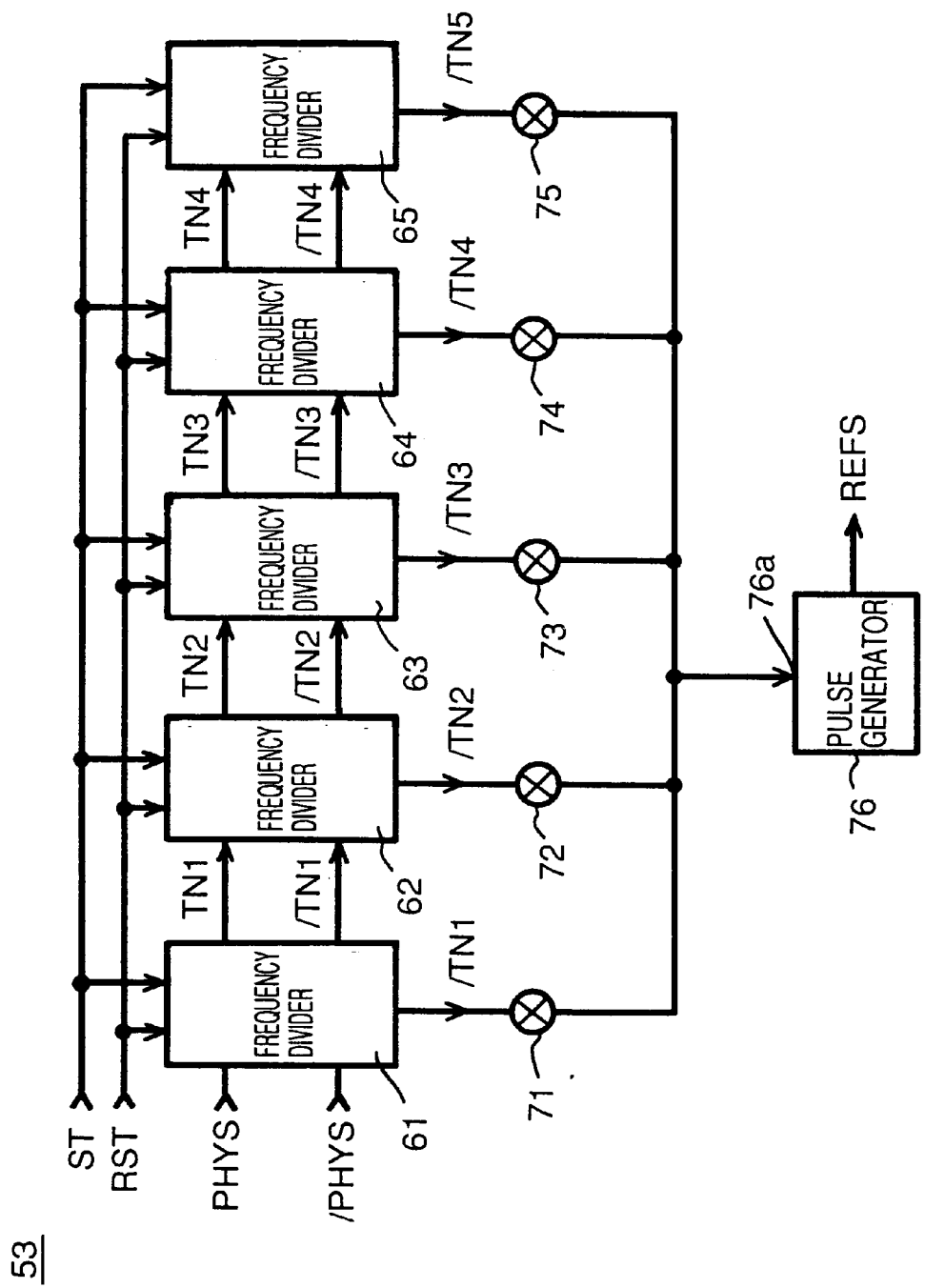
FIG. 13 is a circuit block diagram showing a configuration of the REFS generation circuit shown in FIG. 12.
Figure 14:
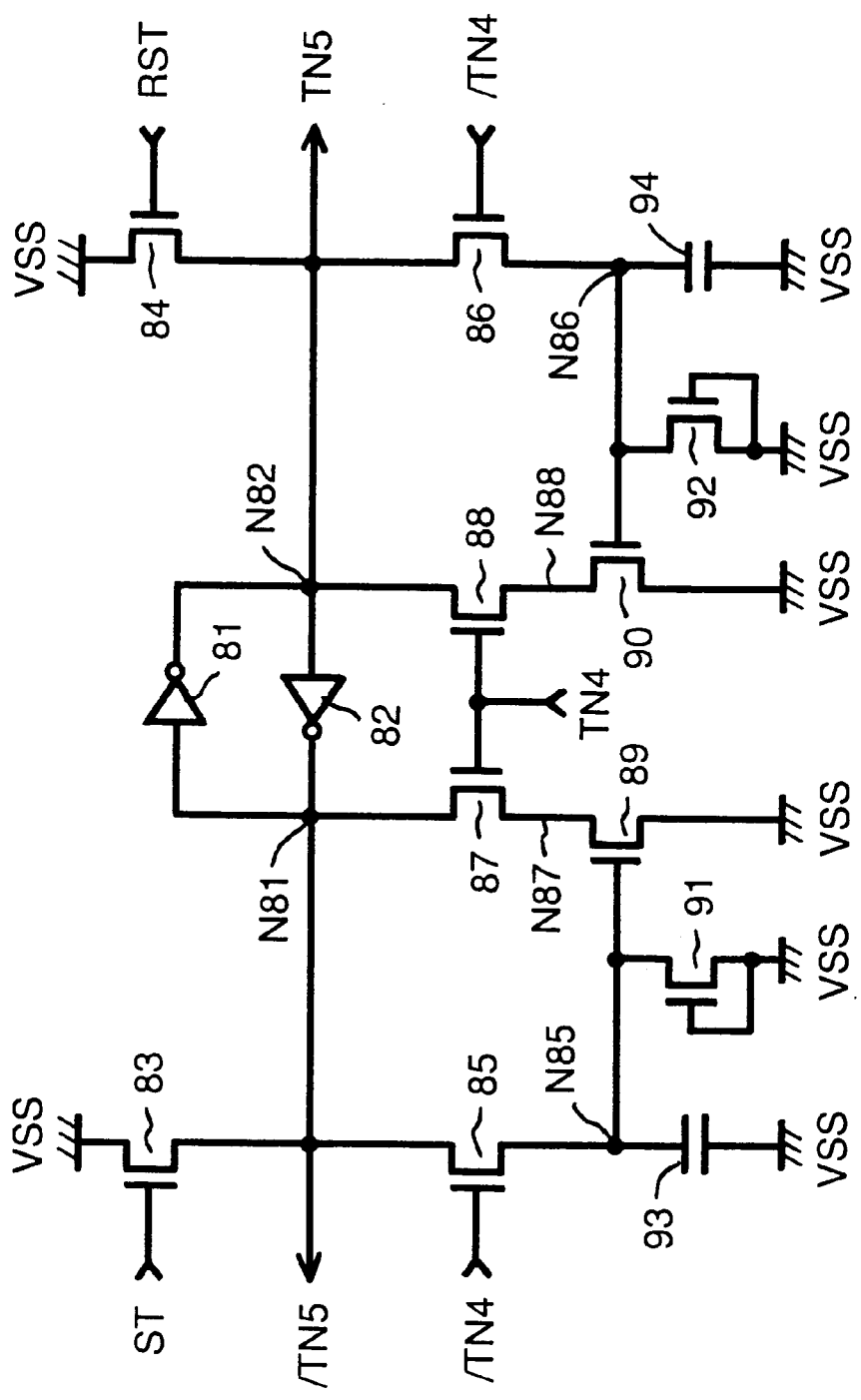
FIG. 14 is a circuit diagram showing a configuration of the frequency divider shown in FIG. 13.
Figure 15:
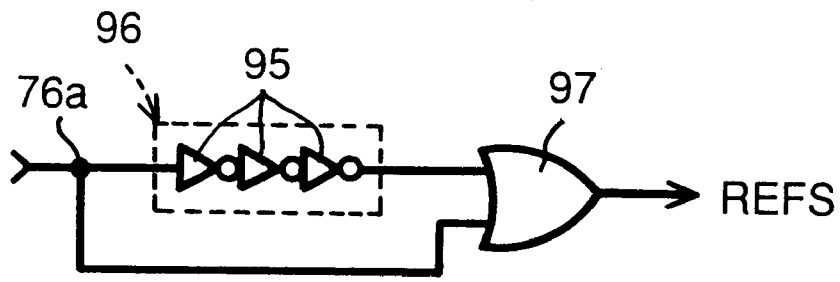
FIG. 15 is a circuit diagram showing a configuration of the pulse generator shown in FIG. 13.
Figure 16:
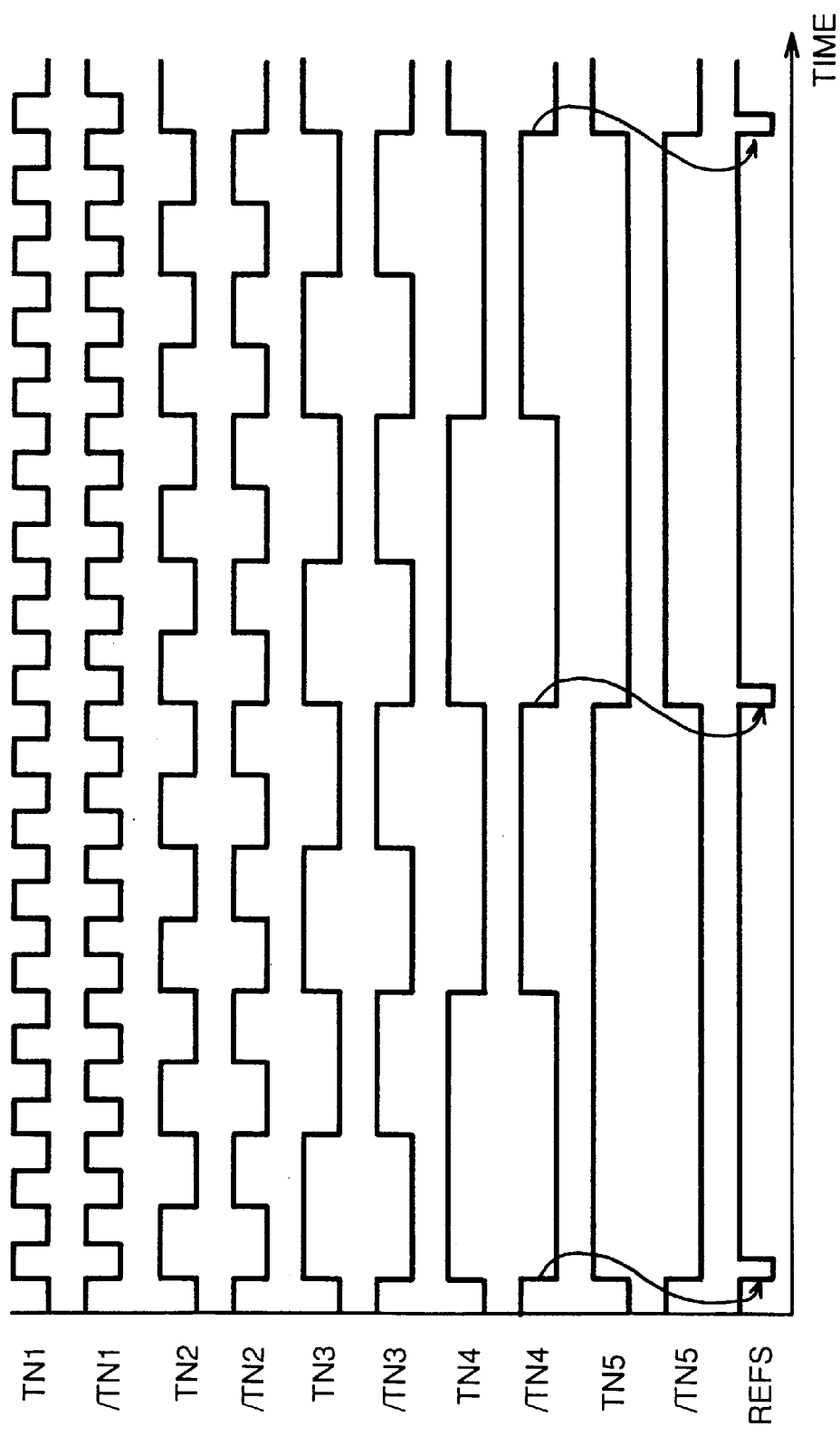
FIG. 16 is a timing chart illustrating an operation of the REFS generation circuit shown in FIGS. 13 to 15.
Figure 17:
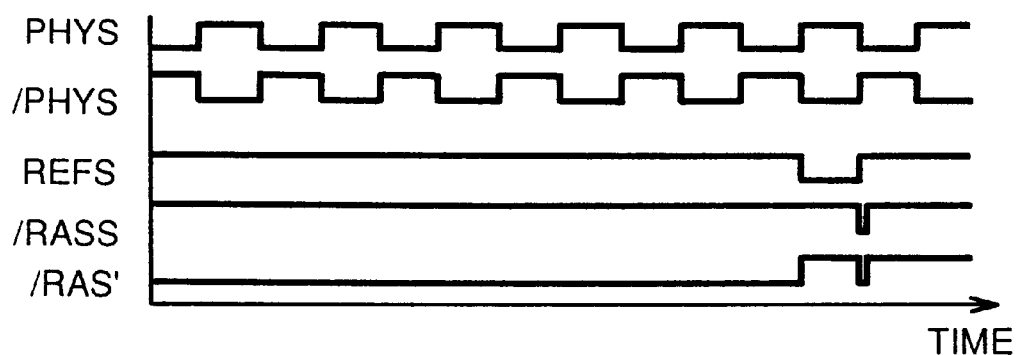
FIG. 17 is a timing chart illustrating an operation of the internal RAS generation circuit shown in FIG. 12.

FIG. 3 is a circuit block diagram comparable to FIG. 13, showing a configuration of an REFS generation circuit 7 included in self refresh circuit 3. In FIG. 3, REFS generation circuit 7 is different from REFS generation circuit 53 in FIG. 13 in that N channel MOS transistors 8a to 8e and P channel MOS transistors 9a to 9e are added. N channel MOS transistors 8a to 8e are connected in parallel with fuses 71 to 75 and have their gates receiving signals SF1, SF2, SF4, SF8, SF16, respectively. P channel MOS transistors 9a to 9e are inserted between the other electrodes of fuses 71 to 75 and an input node 76a of a pulse generator 76 and have their gates receiving signals φ1, φ2, φ4, φ8, φ16, respectively.

In the following, a method of tuning a self refresh cycle of the DRAM shown in FIGS. 1 to 3 will be described. Here, it is set so that fuses 71 to 73 and 75 are blown in a wafer state to carry out self refreshing in the cycle of clock signal /TN4. However, it turns out that the refresh performance has deteriorated after packaging. Therefore, the following description is based on a case where the cycle is reset so as to perform self refreshing in the cycle of clock signal /TN3.

In an initial state, tuning terminals 1a to 1e are not supplied with external signals at all and the potential of tuning terminal 1f, that is, signal φT is set at an L level. Therefore, signals SF1 to SF16 and φ1 to φ16 are all driven to an L level, N channel MOS transistors 8a to 8e and P channel MOS transistors 9a to 9e in REFS generation circuit 7 are rendered non-conductive and conductive, respectively, and output clock signal /TN4 of frequency divider 64 is input to pulse generator 76 through fuse 74 and P channel MOS transistor 9d.

If the self refresh performance has not deteriorated, self refreshing continues as it is. Since the self refresh performance has worsened in this case, the cycle is reset so as to provide self refreshing in the cycle of clock signal /TN3.

As shown in FIGS. 4A to 4L, a super VCC level SVIH is applied to tuning terminal 1c to blow fuse 5c and drive signal φT to an H level. Thus, signal SF4 is driven to an H level, signals SF1, SF2, SF8, SF16 are driven to an L level, N channel MOS transistor 8c in REFS generation circuit 7 is rendered conductive, and N channel MOS transistors 8a, 8b, 8d, 8e in REFS generation circuit 7 are rendered non-conductive. In addition, signal φ4 is driven to an L level, signals φ1, φ2, φ8, φ16 are driven to an H level, P channel MOS transistor 9c in REFS generation circuit 7 is rendered conductive, and P channel MOS transistors 9a, 9b, 9d, 9e in REFS generation circuit 7 are rendered non-conductive. Therefore, output clock signal /TN3 of frequency divider 63 is input to pulse generator 76 through N channel MOS transistor 8c and P channel MOS transistor 9c and thus self refreshing is performed in the cycle of clock signal /TN3. Since other parts and operation are the same as the conventional DRAM, description thereof will not be repeated.

In this embodiment, even if the self refresh performance is lowered by process variation after the self refresh cycle is set in a wafer state, the self refresh cycle can be reset for a product after a DRAM chip is packaged. It is therefore possible to repair a DRAM with worsened self refresh performance.

Second Embodiment

Figure 5:
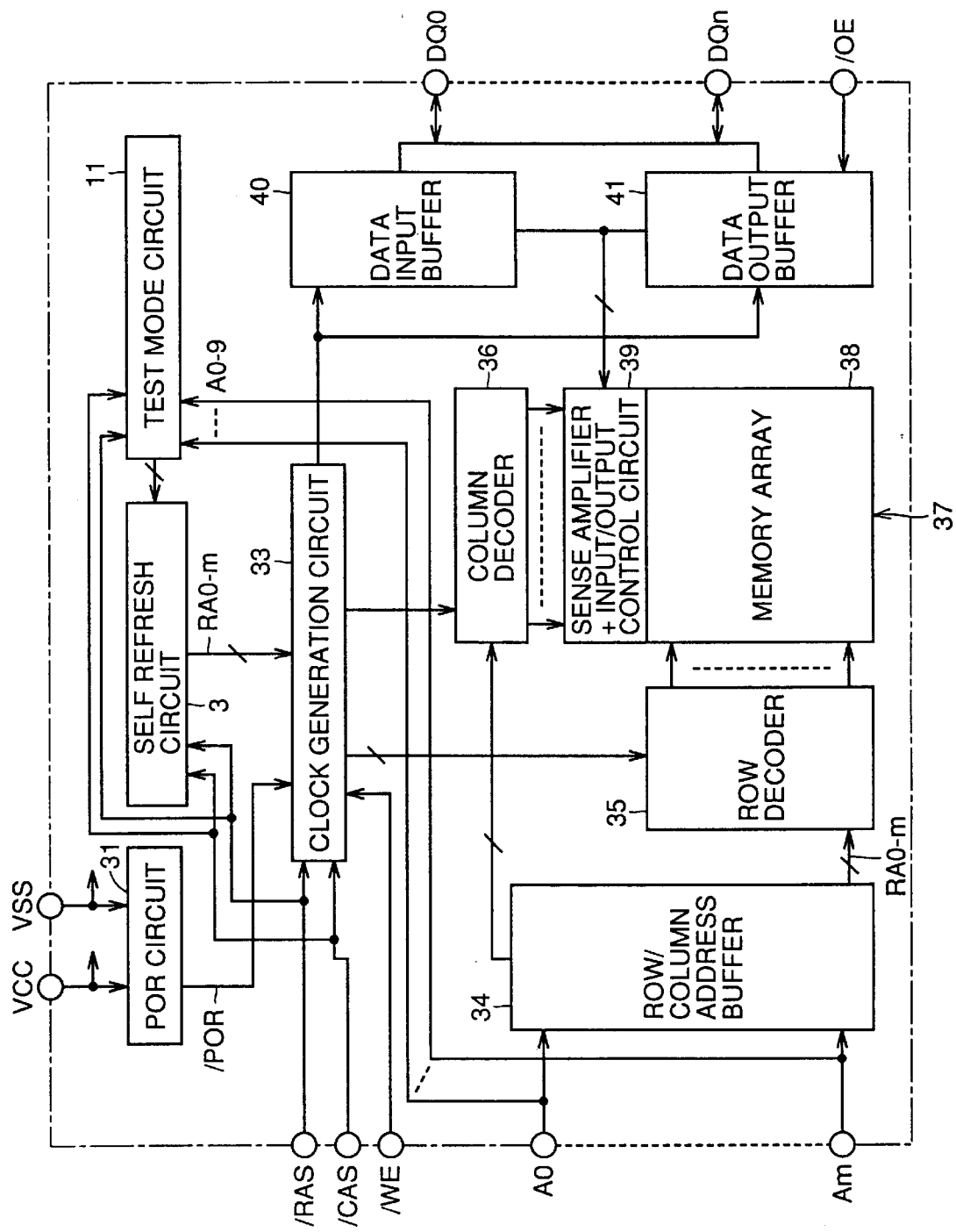
FIG. 5 is a block diagram showing an overall configuration of a DRAM according to a second embodiment of the present invention.

FIG. 5 is a diagram comparable to FIG. 1, showing an overall configuration of a DRAM according to a second embodiment of the present invention. Referring to FIG. 5, the DRAM is different from the DRAM in FIG. 1 in that a test mode circuit 11 is provided instead of tuning terminals 1a to 1f and self tuning circuit 2.

Figure 6:
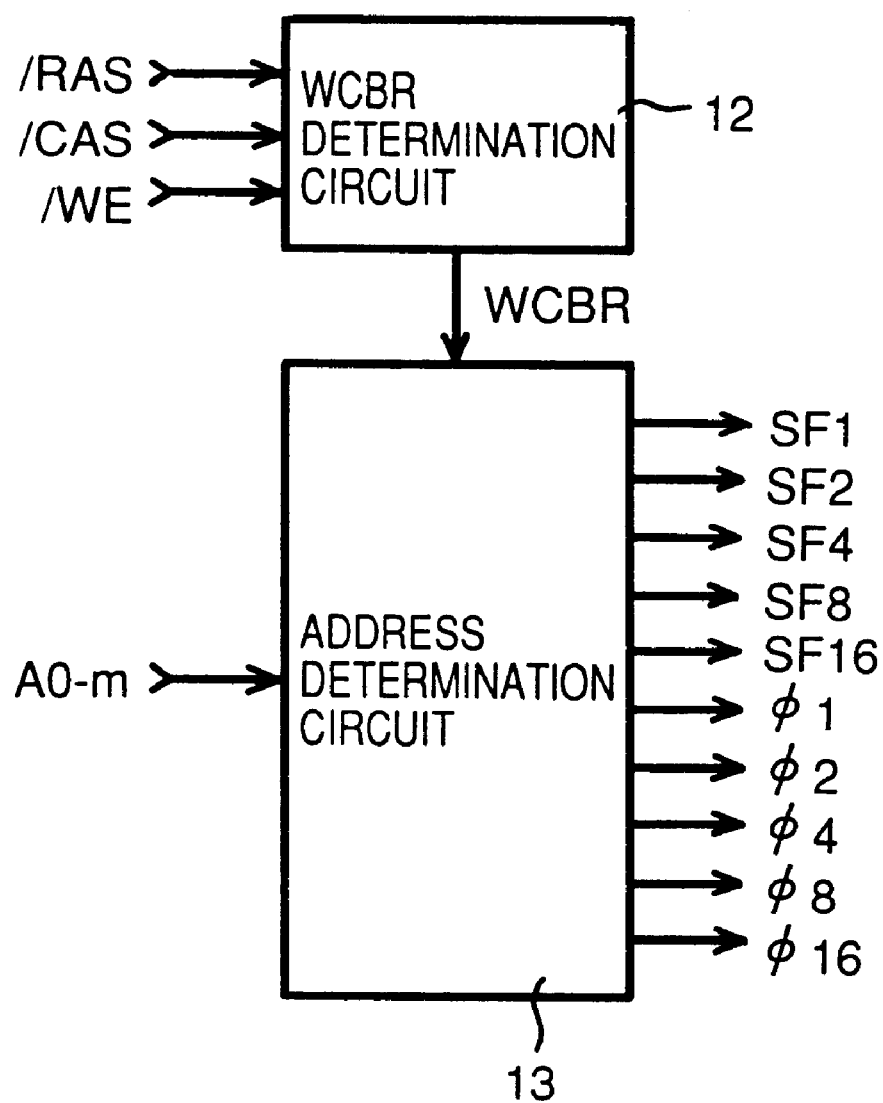
FIG. 6 is a block diagram showing a configuration of the test mode circuit shown in FIG. 5.
Figure 7:
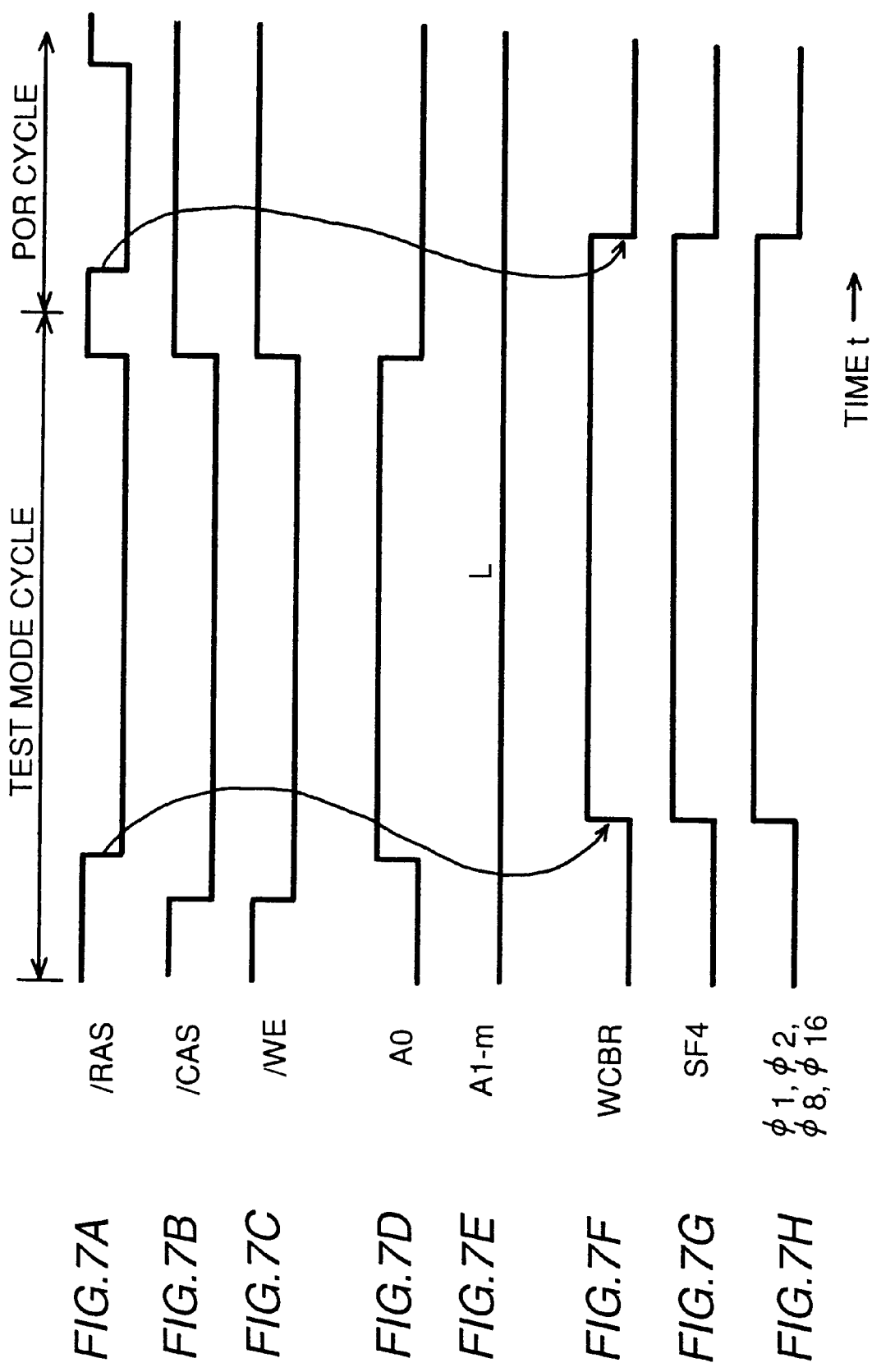
FIGS. 7A to 7H are timing charts illustrating a method of resetting a self refresh cycle of the DRAM shown in FIGS. 5 and 6.

As shown in FIG. 6, test mode circuit 11 includes a WCBR determination circuit 12 and an address determination circuit 13. As shown in FIG. 7, WCBR determination circuit 12 drives a signal WCBR to an H level active state in response to reception of external control signals /RAS, /CAS, /WE at the timing of WCBR (/WE and /CAS before /RAS), that is, in response to external control signal /RAS falling to an L level active state after external control signals /CAS, /WE fall to an L level active state. Furthermore, WCBR determination circuit 12 drives signal WCBR to an L level inactive state in response to reception of signals /RAS, /CAS, /WE at the timing of ROR (/RAS Only Refresh), that is, in response to only signal /RAS attaining the L level after signals /RAS, /CAS, /WE all attain an H level.

Address determination circuit 13 is activated in response to signal WCBR attaining the H level active state, and thus drives only one signal (SF4, for example) of signals SF1, SF2, Sf4, SF8, SF16 to an H level and signals φ1, φ2, φ8, φ16 other than signal φ4, which corresponds to signal SF4, of signals φ1, φ2, φ4, φ8, φ16 to an H level in response to application of a predetermined address signal A0 to Am (for example, A0=H, A1 to Am=L), as shown in FIGS. 7A to 7H. Unique address signals A0 to Am are previously allocated to signals SF1, SF2, SF4, SF8, SF16. Signals SF1 to SF16 and φ1 to φ16 are applied to self refresh circuit 3.

Therefore, the self refresh cycle once set in a wafer state can be changed in a product state even in the second embodiment. In the second embodiment, however, the self refresh cycle is changed only when signal WCBR attains the H level and the cycle is not changed when signal WCBR is at the L level.

Figure 8:
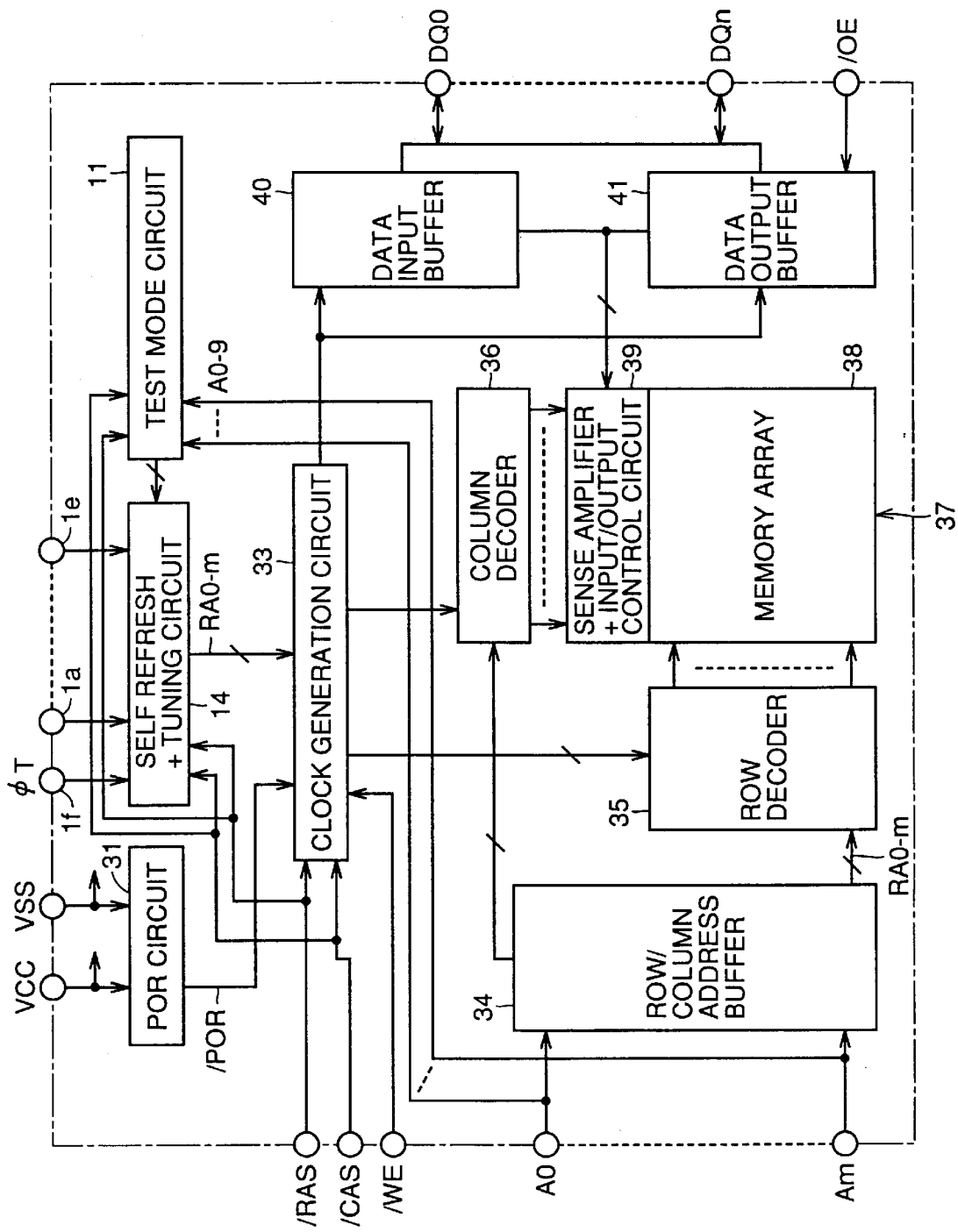
FIG. 8 is a block diagram showing a modification of the second embodiment.

FIG. 8 is a diagram comparable to FIG. 5, showing an overall configuration of a DRAM according to a modification of the second embodiment. The DRAM is different from the DRAM in FIG. 5 in that self refresh circuit 3 is replaced by tuning terminals 1a to l and a self refresh+tuning circuit 14.

Figure 9:
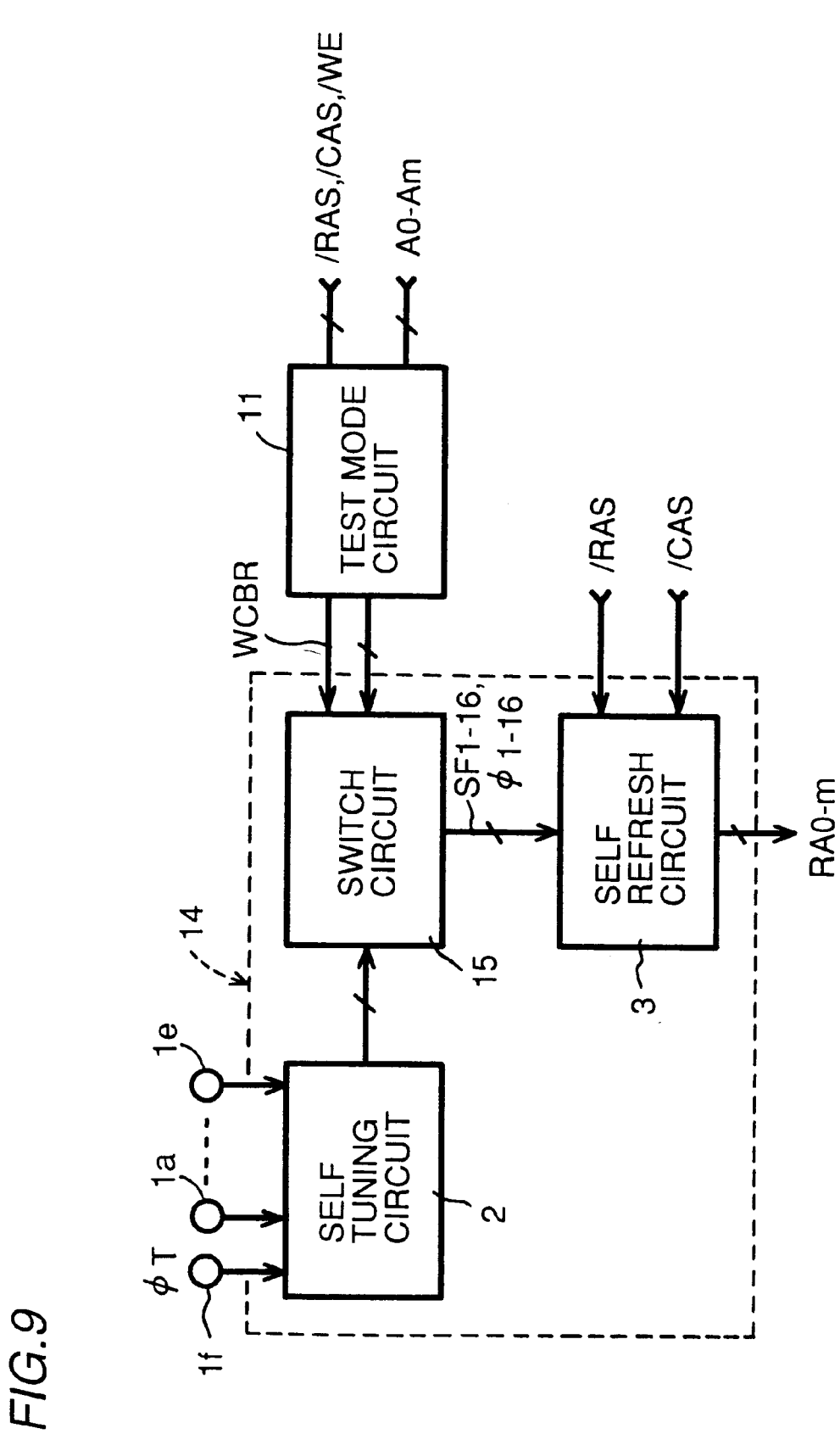
FIG. 9 is a block diagram showing a configuration of the self refresh+tuning circuit shown in FIG. 8.

As shown in FIG. 9, self refresh+tuning circuit 14 includes a self tuning circuit 2, a self refresh circuit 3, and a switch circuit 15. Self tuning circuit 2 and self refresh circuit 3 are the same as those described in the first embodiment. Switch circuit 15 applies signals SF1 to SF16 and φ1 to φ16 generated by test mode circuit 11 to self refresh circuit 3 when signal WCBR is at the H level, and applies signals SF1 to SF16 and φ1 to φ16 generated by self tuning circuit 2 to self refresh circuit 3 when signal WCBR is at the L level.

According to the modification, when the self refresh performance is lowered, test mode circuit 11 is used to temporarily set the self refresh cycle so as to evaluate the refresh performance. Based on the evaluation result, it is possible to set the self refresh cycle to an optimum value by using tuning terminals 1a to 1f.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a self refresh mode, comprising:

a memory array including a plurality of memory cells arranged in rows and columns;

a clock generation circuit for generating a plurality of clock signals having different frequencies from one another during said self refresh mode;

a first selection circuit including a plurality of first fuses for selecting one clock signal of said plurality of clock signals;

a second selection circuit for selecting one clock signal of said plurality of clock signals according to an external signal;

a gate circuit for receiving the plurality of clock signals generated by said clock generation circuit, passing a clock signal when the clock signal is selected by said second selection circuit, and otherwise passing a clock signal selected by said first selection circuit; and a refresh execution circuit for refreshing data in said memory cell in synchronization with the clock signal which has passed through said gate circuit.

2. The semiconductor memory device according to claim 1, wherein said second selection circuit includes a plurality of second fuses provided correspondingly to said plurality of clock signals and each having one electrode connected to a reference potential line, an external terminal provided correspondingly to each second fuse and connected to another electrode of a corresponding second fuse for applying a prescribed potential to blow the corresponding second fuse, and a logic circuit activated in response to reception of an external activation signal for selecting a clock signal corresponding to the blown second fuse of the plurality of second fuses.

3. The semiconductor memory device according to claim 1, wherein said second selection circuit includes an address determination circuit activated in response to reception of an external activation signal for selecting one clock signal of said plurality of clock signals according to a plurality of external address signals.

4. The semiconductor memory device according to claim 1, wherein one electrode of each of said plurality of first fuses in said first selection circuit receives one of said plurality of clock signals, and said gate circuit includes a first transistor provided correspondingly to each first fuse, connected in parallel with a corresponding first fuse, and rendered conductive in response to selection of a clock signal corresponding to the corresponding first fuse by said second selection circuit, and a second transistor provided correspondingly to each first fuse, connected in series with a corresponding first fuse, and rendered non-conductive in response to selection of a clock signal other than the clock signal corresponding to the corresponding first fuse by said second selection circuit.

* * * * *